(12) United States Patent
Kim et al.

(10) Patent No.: US 6,403,495 B2
(45) Date of Patent: Jun. 11, 2002

(54) CAPACITOR FABRICATING METHOD OF SEMICONDUCTOR DEVICE

(75) Inventors: Young-sun Kim; Young-wook Park, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/742,650

(22) Filed: Dec. 21, 2000

Related U.S. Application Data

(62) Division of application No. 08/729,232, filed on Oct. 9, 1996, now Pat. No. 6,194,263.

(30) Foreign Application Priority Data

Oct. 10, 1995 (KR) .............................. 95-34751
Sep. 25, 1996 (KR) .............................. 96-42688

(51) Int. Cl.$^7$ .............................................. H01L 21/00
(52) U.S. Cl. .................... 438/719; 438/723; 438/735; 438/743
(58) Field of Search ................ 438/719, 723, 438/735, 743; 216/67, 79

(56) References Cited

U.S. PATENT DOCUMENTS

| | | | |
|---|---|---|---|
| 5,234,862 A | 8/1993 | Aketagawa et al. | 437/103 |
| 5,330,614 A | 7/1994 | Ahn | 156/631 |
| 5,366,917 A | 11/1994 | Watanabe et al. | 437/47 |
| 5,372,962 A | 12/1994 | Hirota et al. | 437/47 |
| 5,385,863 A | 1/1995 | Tatsumi et al. | 437/109 |
| 5,394,012 A | 2/1995 | Kimura | 257/739 |
| 5,405,801 A | 4/1995 | Han et al. | 437/60 |
| 5,464,791 A | 11/1995 | Hirota | 437/60 |
| 5,486,488 A | 1/1996 | Kamiyama | 437/60 |
| 5,543,347 A | 8/1996 | Kawano et al. | 437/60 |
| 5,554,557 A | 9/1996 | Koh | 437/52 |
| 5,567,637 A | 10/1996 | Hirota | 437/43 |
| 5,590,051 A | 12/1996 | Yokozawa | 364/496 |
| 5,595,937 A | 1/1997 | Mikagi | 437/192 |
| 5,616,511 A | 4/1997 | Hirota | 438/396 |
| 5,623,243 A | 4/1997 | Watanabe et al. | 257/309 |
| 5,679,596 A | 10/1997 | Lu | 438/396 |
| 5,723,373 A | 3/1998 | Chang et al. | 438/253 |
| 5,726,085 A | 3/1998 | Crenshaw et al. | 438/255 |
| 5,759,891 A | 6/1998 | Tseng | 438/253 |
| 5,821,152 A | 10/1998 | Han et al. | 438/398 |
| 5,869,368 A | 2/1999 | Yew et al. | 438/255 |
| 5,913,119 A | 6/1999 | Lin et al. | 438/255 |
| 5,930,625 A | 7/1999 | Lin et al. | 438/253 |
| 5,966,612 A | 10/1999 | Wu | 438/398 |
| 5,972,771 A | 10/1999 | Figura | 438/398 |

FOREIGN PATENT DOCUMENTS

JP      4-286151     10/1992

OTHER PUBLICATIONS

H. Watanabe et al; A New Cylindrical Capacitor Using Hemispherical Grained Si (HSG–Si) for 256Mb DRAMS, 1992 IEEE, IEDM 92, Apr. 1992, 10.1.1–10.1.4, pp 259–262.

*Primary Examiner*—William A. Powell
(74) *Attorney, Agent, or Firm*—Myers Bigel Sibley & Sajovec

(57) ABSTRACT

A method for fabricating a capacitor of a semiconductor device is provided. In the capacitor fabricating method, the step of forming a lower electrode by using gas including chlorine is included after the step of forming hemispherical grained silicon (HSG—Si) seeds. Also, after the step of selectively growing only HSG—Si seeds formed on the lower electrode, the step of removing the HSG—Si seeds formed on an insulation layer pattern through an etching process using a gas including chlorine is included. Thus, the surface area of the lower electrode is increased, so that capacitance is increased. Also, an electrical short between the lower electrodes of each adjacent capacitor can be prevented without decreasing capacitance.

18 Claims, 4 Drawing Sheets

US 6,403,495 B2

CAPACITOR FABRICATING METHOD OF SEMICONDUCTOR DEVICE

RELATED APPLICATIONS

This is a divisional application of U.S. application Ser. No. 08/729,232 entitled "Capacitor Fabricating Method of Semiconductor Device" filed Oct. 9, 1996, now U.S Pat. No. 6,194,263, which claims priority from Korean Patents 95-34751 filed Oct. 10, 1995 and 96-42688 filed Sep. 25, 1996.

BACKGROUND OF THE INVENTION

The present invention relates to a capacitor fabricating method of a semiconductor device, and more particularly, to a capacitor fabricating method of a semiconductor device in which a ridge and valley-type lower electrode is formed using a hemispherical grained silicon (HSG—Si).

A decrease in cell capacitance according to the decrease of cell memory area is an obstacle to the increase in stability of a dynamic random access memory (DRAM). The decrease in cell capacitance lowers the reading and writting abilities of the memory cell, increases the soft error ratio, and further disturbs the operation of the device at lower voltages. Thus, for high integration of the semiconductor memory device, the decrease in cell capacitance should be overcome.

Generally, in 64Mb DRAMs having a memory cell area of approximately 1.5 $\mu m^2$, it is difficult to provide sufficient capacitance even when a dielectric substance such as $Ta_2O_5$ is used in a general stacked-type capacitor having a two-dimensional structure. Thus, recently, a capacitor having a three-dimensional structure has been suggested to increase cell capacitance, such as a lower electrode having a fin structure (Fujitsu), a lower electrode having a box structure (Toshiba), a lower electrode having a cylindrical structure (Mitsubishi), etc.

However, in the case of the capacitor having a three-dimensional structure, the fabrication process thereof is complicated and a defect may occur in the fabrication process, thus applying such structure is difficult. Also, research into a high dielectric film has been conducted in order to increase the capacitance of the capacitor, however, the high dielectric film has many problems in application. Thus, research into a method for fabricating a ridge and valley-type lower electrode, in which area is locally increased, has been performed to increase capacitance.

In one method of fabricating the ridge and valley-type lower electrode, multiple bumps of HSG—Si are formed on the surface of the lower electrode to form ridges and valleys in the surface thereof, thereby increasing the surface area of the lower electrode.

As a method for forming HSG—Si on the surface of the lower electrode, there are following methods: 1) a chemical vapor deposition method in which silicon is deposited at a temperature where phase transformation occurs from amorphous silicon to polysilicon, 2) a method for annealing amorphous silicon without native oxide layer in a vacuum, and 3) a seeding method in which HSG—Si seeds are formed by a low pressure chemical deposition (LPCVD) method using $SiH_4$ or $Si_2H_6$ gas, or by irradiating $SiH_4$ or $Si_2H_6$ beam on the amorphous silicon, and then the formed seeds are grown.

It has been reported that the surface area of the lower electrode is effectively increased when the ridge and valley-type silicon lower electrode is formed using the seeding method in an article by H. Watanabe et al., *A New Cylindrical Capacitor Using HSG—Si for 256Mb DRAMs,* IEDM '92, pp. 259–262.

FIGS. 1 through 3 are cross-sectional diagrams for illustrating a conventional method for fabricating a capacitor of a semiconductor device.

FIG. 1 is a cross-sectional diagram for illustrating the step of forming an insulation layer pattern 20 and a lower electrode 40. First, an insulation layer such as a silicon oxide layer is formed on a semiconductor substrate 10 and then the insulation layer is patterned by a photolithography process to form the insulation pattern 20 having a contact hole which exposes a predetermined area of the semiconductor substrate 10.

Subsequently, after an amorphous silicon layer doped with impurity is formed on the entire surface of the substrate having the insulation later pattern 20 to fill the contact hole, the resultant structure is patterned by a general method. As a result, the lower electrode 40 having a cylindrical structure is formed on a predetermined area of the insulation layer pattern 20, which is connected to the exposed semiconductor substrate via the contact hole.

FIG. 2 is a cross-sectional diagram for illustrating the step of forming HSG—Si seeds 50a and 50b, wherein the HSG—Si seeds are formed on the lower electrode 40 by a low-pressure chemical deposition (LPCVD) method using a silicon source gas. Here, since the HSG—Si seeds are formed first at a portion of the lower electrode 40 with high surface energy, the HSG—Si seeds are scattered on the surface of the lower electrode 40. Also, as the silicon source gas, $SiH_4$, $Si_2H_6$, $Si_3H_8$, $SiH_2Cl_2$ or $SiH_2Cl_2$ is used.

Of course, the HSG—Si seeds may be formed on the lower electrode 40 by irradiating the silicon source gas as a beam on the entire surface of the substrate having the lower electrode 40.

Since the selectiveness of the HSG—Si seed formation process is very low, the HSG—Si seeds are formed on the insulation layer pattern 20 during the step of forming HSG—Si seeds on the lower electrode 40. Hereinafter, HSG—Si seeds formed on the lower electrode 40 will be referred to as first HSG—Si seeds 50a, and HSG—Si seeds formed on the insulation layer pattern 20 will be referred to as second HSG—Si seeds 50b, respectively.

FIG. 3 is a cross-sectional diagram for illustrating the step of forming HSG—Si 50c. Here, the substrate having the first and second silicon seeds 50a and 50b is heated to selectively grow the first HSG—Si seeds 50a, thereby forming the HSG—Si 50c on the lower electrode 40. As a result, the surface area of the lower electrode 40 is increased. Here, since the first HSG—Si seeds 50a grow by receiving silicon from the lower electrode 40 differently from the second HSG—Si seeds 50b which cannot receive silicon required for growth, only the first HSG—Si seeds 50a are grown.

Here, the second HSG—Si seeds 50b remain on the insulation layer pattern 20, so that the lower electrode 40 and a lower electrode of a capacitor adjacent thereto are electrically shorted, causing mis-operation of the semiconductor device. Also, since an increase in area at the lower electrode 40 depends only on the growth of the first HSG—Si seeds 50a, it is difficult to obtain sufficient cell capacitance for ensuring reliable operation of the semiconductor device.

Further, a dielectric layer and an upper electrode are formed in sequence on the entire surface of the substrate having the HSG—Si 50c to complete a capacitor, wherein this step is not shown.

As described above, in the conventional method for fabricating a capacitor of a semiconductor device, the second HSG—Si seeds 50b remain on the insulation pattern 20, so that the lower electrodes of each adjacent capacitors are susceptible to electrical shorts. Also, since the increase in area of the lower electrode 40 depends only on the growth of the first HSG—Si seeds 50a, there are difficulties in the ensuring sufficient cell capacitance. Thus, reliability of the semiconductor device is decreased.

SUMMARY OF THE INVENTION

To overcome the above problems, it is an object of the present invention to provide a method for fabricating a capacitor of a semiconductor device, which can improve reliability of the semiconductor device.

According to the first embodiment for achieving the object, there is provided a method for forming a capacitor of a semiconductor device comprising the steps of: (a) forming an insulation layer pattern on a semiconductor substrate, having a contact hole which exposes a predetermined area of the semiconductor substrate; (b) forming a lower electrode on a predetermined area of the insulation layer pattern, the lower electrode is connected to the exposed semiconductor substrate via the contact hole; (c) forming HSG—Si seeds on the surfaces of the lower electrode and the insulation layer pattern; (d) etching the surface of the lower electrode by using the HSG—Si seeds formed on the surface of the lower electrode as an etching mask to form a depressed portion on the surface of the lower electrode, resulting in the formation of a modified lower electrode; and (e) growing the HSG—Si seeds formed on the surface of the lower electrode to form multiple bumps of HSG—Si.

Here, the step (d) of etching the surface of the lower electrode is performed using a gas including chlorine, and the gas including chlorine is one selected from the group consisting of $Cl_2$, $BCl_3$, $ClF_3$ and HCl.

Also, preferably, the step (d) of etching the surface of the lower electrode is performed by anisotropically etching while varying the incident angle of etching gas.

Preferably, the step (e) of growing the HSG—Si seeds is performed by heating the substrate having the HSG—Si seeds, and the heating is performed at 560~630° C.

Also, it is preferably that the method for forming a capacitor of a semiconductor device further comprises the step of removing the HSG—Si seeds formed on the surface of the insulation layer pattern by an etching after the step (e). Here, the step of removing HSG—Si seeds formed on the surface of the insulation layer pattern by an etching is performed by using the gas including chlorine, and the gas including chlorine is one selected from the group consisting of $Cl_2$, $BCl_3$, $ClF_3$ and HCl.

According to the second embodiment for achieving the object, there is provided a method for forming a capacitor of a semiconductor device comprising the steps of: (a) forming an insulation layer pattern on a semiconductor substrate, having a contact hole which exposes a predetermined area of the semiconductor substrate; (b) forming a lower electrode on a predetermined area of the insulation layer pattern, the lower electrode is connected to the exposed semiconductor substrate via the contact hole; (c) forming HSG—Si seeds on the surfaces of the lower electrode and the insulation layer pattern; (d) selectively growing the HSG—Si seeds formed on the surface of the lower electrode to form multiple bumps of HSG—Si on the surface of the lower electrode; (e) removing the HSG—Si seeds formed on the surface of the insulation layer pattern through an etching process.

Also, the step (c) of forming the HSG—Si seeds is performed by a chemical vapor deposition (CVD) method using a silicon source gas.

It is preferably that the step (d) of forming the HSG—Si is performed by heating the substrate having the HSG—Si seeds, and the heating is performed at 560~630° C.

In addition, the step of removing the HSG—Si seeds formed on the surface of the insulation layer pattern by an etching is performed by using a gas including chlorine, and the gas including chlorine is one selected from the group consisting of $Cl_2$, $BCl_3$, $ClF_3$ and HCl.

In the method for fabricating a capacitor of a semiconductor device according to the present invention, the surface area of the lower electrode is increased, so that a high cell capacitance can be ensured compared to that of the conventional device. Also, an electrical short between the lower electrodes of adjacent capacitors can be prevented without decreasing capacitance.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Embodiment 1

The method for fabricating a capacitor of a semiconductor device according to a first embodiment of the present invention will be described with reference to FIGS. 4 through 7.

Figure 1:
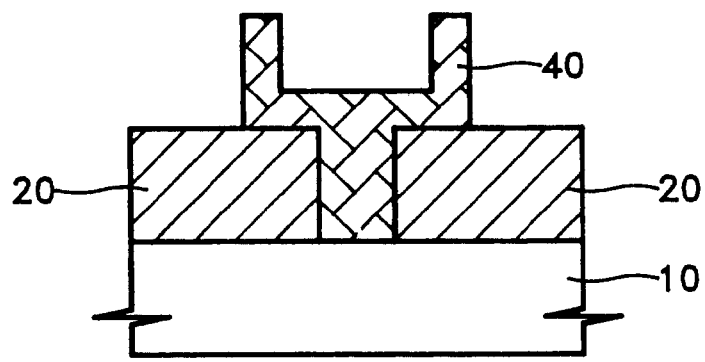
FIGS. 1 through 3 are diagrams illustrating a conventional method for fabricating a capacitor of a semiconductor device.
Figure 2:
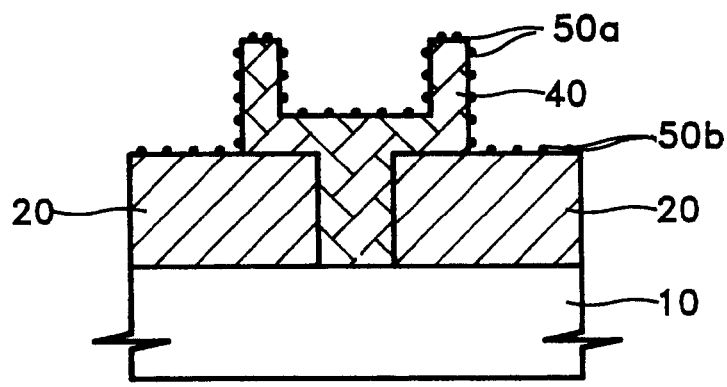
Figure 3:
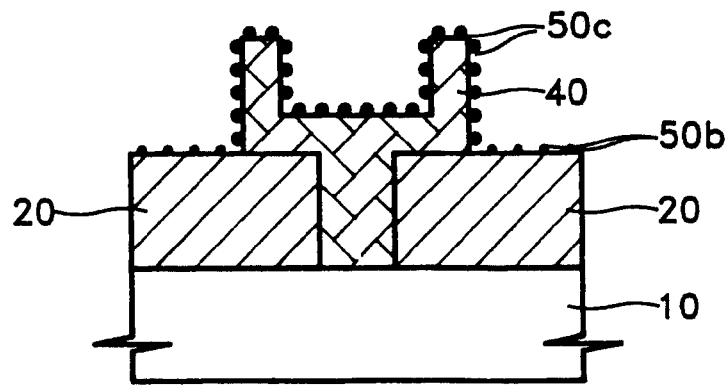
Figure 4:
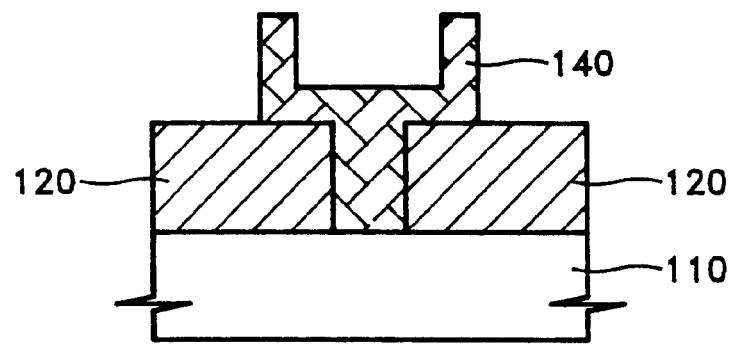
FIGS. 4 through 7 are diagrams illustrating a method for fabricating a capacitor of a semiconductor device according to a preferred embodiment of the present invention.
Figure 5:
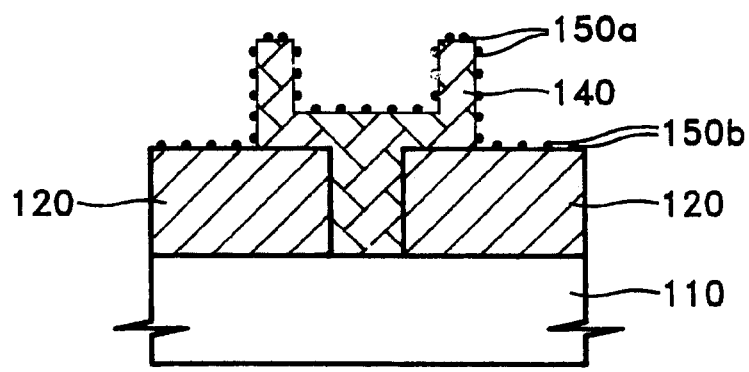

FIG. 4 is a cross-sectional diagram for illustrating the step of forming an insulation layer pattern 120 and a lower electrode 140, and FIG. 5 is a cross-sectional diagram for illustrating the step of forming first and second hemispherical grained silicon (HSG—Si) seeds 150a and 150b. Here, the insulation pattern 120, the lower electrode 140, the first HSG—Si seeds 150a and the second HSG—Si seeds 150b are formed in the same manner as the conventional method described with reference to FIGS. 1 and 2.

Figure 6:
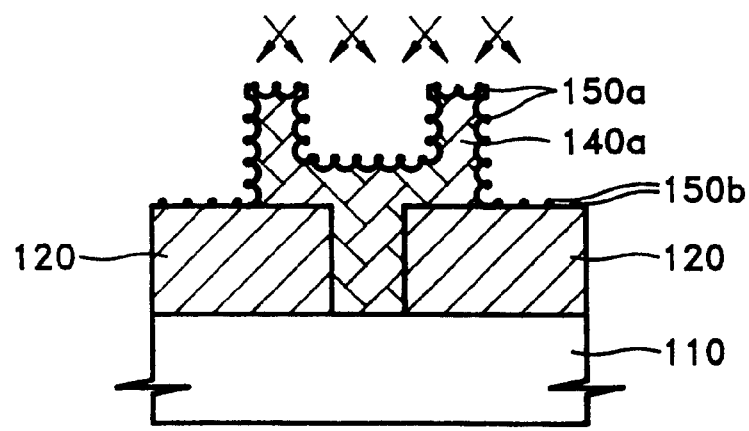

FIG. 6 is a cross-sectional diagram for illustrating the step of forming a modified lower electrode 140a. Here, the surface of the lower electrode 140 is etched by using the first HSG—Si seeds 150a as an etching mask to form a depressed portion on the surface of the lower electrode 140, resulting in the formation of a modified lower electrode 140a. Also, preferably, gas including chlorine such as $Cl_2$, $BCl_3$, $ClF_3$ and HCl is used during the etching process.

The HSG—Si seeds 150a and 150b and the insulation layer pattern 120 are more resistant to etching than the lower electrode 140 with respect to the gas including chlorine, so that the HSG—Si seeds 150a and 150b, and the insulation layer pattern 120 are etched less than the lower electrode 140. Here, preferable, anisotropic etching is performed while varying the incident angle, for effectively forming the depressed portion to create a larger surface area.

Figure 7:
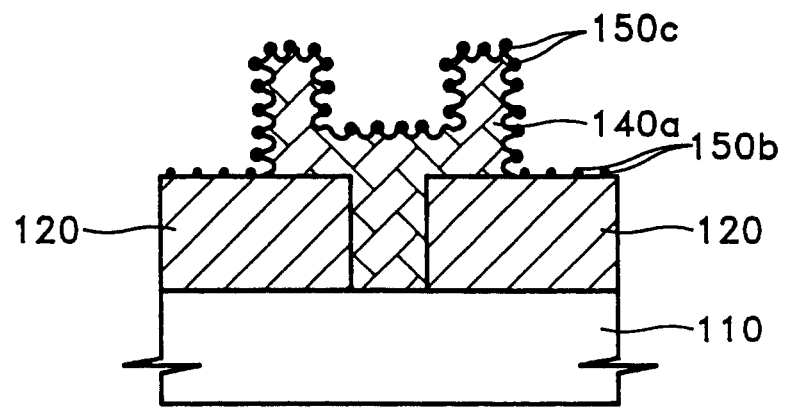

FIG. 7 is a cross-sectional diagram for illustrating the step of forming HSG—Si 150c, wherein the substrate having the modified lower electrode 140a is heated at 560~630° C. to selectively grow the first HSG—Si seeds 150a, thereby forming the HSG—Si 150c on the modified lower electrode 140a. Here, since the first HSG—Si seeds 150a grows by receiving silicon from the modified lower electrode 140a while the second HSG—Si seeds 150b does not receive silicon required for growth, the first HSG—Si seeds 150a are grown selectively.

According to this preferred embodiment, after forming the HSG—Si seeds 150a and 150b, the step of etching the lower electrode 140 using gas including chlorine is further performed differently from the conventional method, resulting in a ridge and valley-type lower electrode in which the ridges and valleys is more severe than that of the conventional one. Thus, the surface area of the lower electrode is increased, so that a capacitance can be provided which is greater than that of the conventional method.

Embodiment 2

Figure 8:
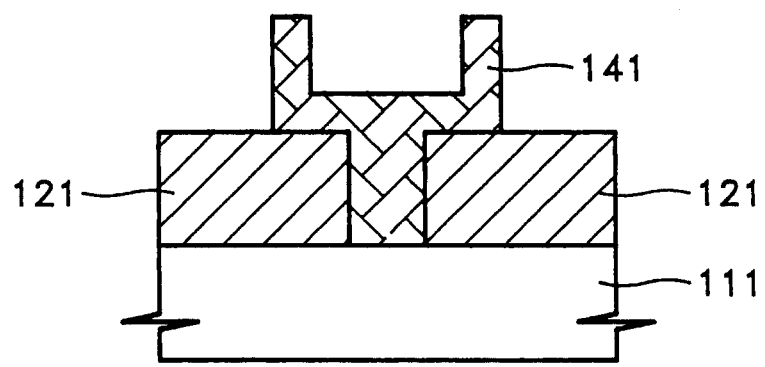
FIGS. 8 through 11 are diagrams illustrating a method for fabricating a capacitor of a semiconductor device according to another preferred embodiment of the present invention.
Figure 9:
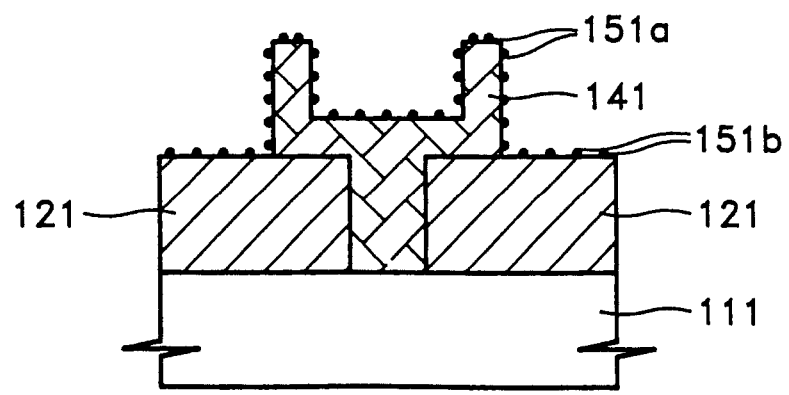
Figure 10:
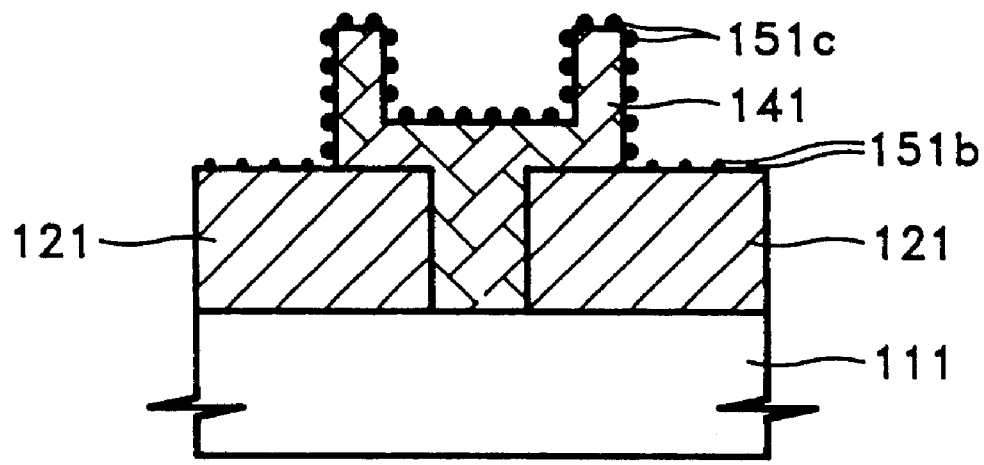

FIGS. 8 through 10 are cross-sectional diagrams for illustrating a method for fabricating a capacitor of a semiconductor device according to a second embodiment of the present invention.

FIG. 8 is a cross-sectional diagram for illustrating the step of forming an insulation layer pattern 121 and a lower electrode 141, and FIG. 9 is a cross-sectional diagram for illustrating the step of forming first and second HSG—Si seeds 151a and 151b. Here, the insulation layer 121, the lower electrode 141, and the first and second HSG—Si seeds 151a and 151b are formed in the same manner as the conventional method described with reference to FIGS. 1 and 2.

FIG. 10 is a cross-sectional diagram for illustrating the step of forming HSG—Si 151c. Here, the substrate having first and second HSG—Si seeds 151a and 151b is heated at 560~630° C. to selectively grow only the first HSG—Si seeds 151a, resulting in the formation of HSG—Si 151c on the lower electrode 141. Since the first HSG—Si seeds 151a grows by receiving silicon from the lower electrode 141 while the second HSG—Si seeds 151b do not receive silicon required for growth, only the first HSG—Si seeds 151a grow.

Figure 11:
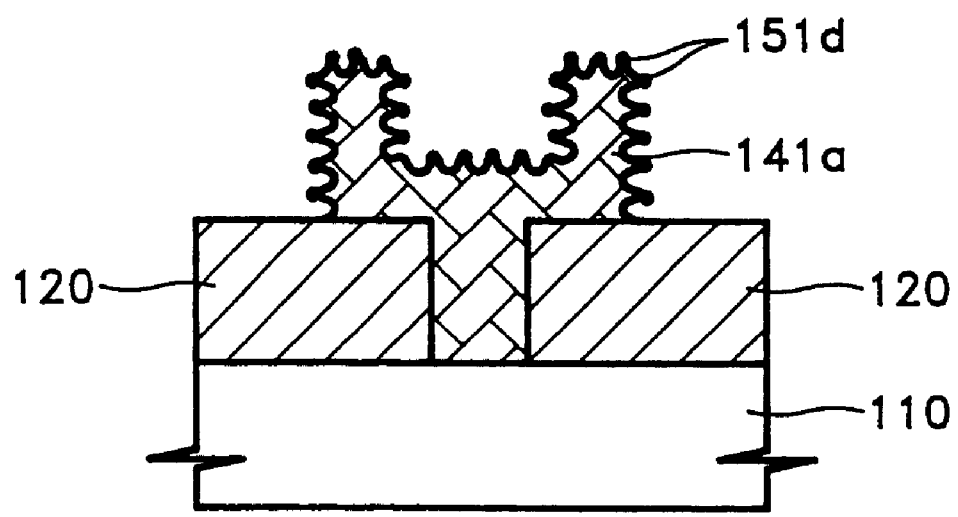

FIG. 11 is a cross-sectional diagram for illustrating the step of removing the second HSG—Si seeds 151b, wherein the entire surface of the substrate having the HSG—Si 151c is etched using gas including chlorine such as $Cl_2$, $BCl_3$, $ClF_3$ and HCl, thereby removing the second HSG—Si seeds 151b.

Here, the HSG—Si 151c are slightly etched, resulting in the formation of a modified HSG—Si 151d whose size is reduced. Also, when removing the second HSG—Si seeds 151b, the lower electrode 141 is etched for the same reason described with reference FIG. 6, so that a modified lower electrode 141a having a depressed portion on the surface thereof is formed. Thus, the surface area of the lower electrode 141 is not changed significantly.

According to this preferred embodiment, after selectively growing only the first HSG—Si seeds 151a, the second HSG—Si seeds 151b are removed through an etching process using a gas including chlorine. As a result, an electrical short between the lower electrodes of each adjacent capacitor can be prevented without a decrease in capacitance.

Also, preferably, the first embodiment of the present invention further includes the step of removing the second HSG—Si seeds 150b of FIG. 7 through the etching process described in FIG. 10, after the step of forming HSG—Si 150c of FIG 7.

As described above, in the method of fabricating a capacitor of a semiconductor device according to the present invention, the surface area of the lower electrode is increased, so that a capacitance higher than that of the conventional method can be ensured. Also, the electrical short between the lower electrodes of each adjacent capacitor can be prevented without a decrease in capacitance.

The present invention is not limited to the particular forms illustrated, and further modifications and alterations will be apparent to those skilled in the art within the spirit and scope of this invention.

What is claimed is:

1. A method for forming a dynamic random access memory, said method comprising the steps of:

forming a memory cell access transistor on a semiconductor substrate wherein said memory cell access transistor includes a source/drain at the surface of the semiconductor substrate;

forming an insulating layer on said semiconductor substrate and said memory cell access transistor wherein said insulating layer has a contact hole therein exposing a portion of said source/drain of said memory cell access transistor;

forming a first capacitor electrode on said insulating layer wherein said first capacitor electrode is connected to said source/drain of said memory cell access transistor through said contact hole;

forming HSG—silicon seeds on the surface of the first capacitor electrode and on said insulating layer;

selectively growing said HSG—silicon seeds on said first capacitor electrode to form enlarged HSG silicon bumps on said first capacitor electrode;

removing said HSG—silicon seeds formed on said insulating layer;

forming a dielectric layer on said first capacitor electrode and on said HSG—silicon seeds; and forming a second capacitor electrode on said dielectric layer opposite said first capacitor electrode.

2. A method according to claim 1 further comprising the steps of:

etching said first capacitor electrode using said HSG—silicon bumps as a mask so that pits are formed between said HSG—silicon bumps.

3. A method according to claim 1 wherein said step of selectively growing said HSG—silicon seeds comprises heating said first capacitor electrode and said HSG—silicon seeds.

4. A method according to claim 3 wherein said step of growing said HSG—silicon seeds comprises heating said first capacitor electrode and said HSG—silicon seeds to a temperature in the range of 560° C. to 630°.

5. A method according to claim 4 wherein said first capacitor electrode is formed from silicon.

6. A method according to claim 1 wherein said step of forming said HSG—silicon seeds is performed by chemical vapor deposition using a silicon source gas.

7. A method according to claim 1 wherein said step of removing said HSG—silicon seeds from insulating layer comprises etching said HSG—silicon seeds using an etching gas including chlorine.

8. A method according to claim 7 wherein said etching gas is chosen from the group consisting of $Cl_2$, $Bcl_3$, $ClF_3$ and HCl.

9. A method for forming an electrode structure on a microelectronic substrate, said method comprising the steps of:

forming a conductive electrode on the microelectronic substrate;

forming HSG—silicon seeds on said conductive electrode and on the microelectronic substrate;

selectively growing said HSG—silicon seeds on said conductive electrode to form enlarged HSG—silicon bumps on said conductive electrode; and removing said HSG—silicon seeds formed on the microelectrode substrate.

10. A method according to claim 9 further comprising the step of:

etching said conductive electrode using said HSG—silicon bumps as a mask so that pits are formed between said HSG—silicon bumps.

11. A method according to claim 9 wherein said removing step is followed by the steps of:

forming a dielectric layer on said conductive electrode and said HSG—silicon bumps; and forming a second conductive electrode on said dielectric layer opposite said first conductive electrode.

12. A method according to claim 9 wherein said step of selectively growing said HSG—silicon seeds comprises heating said conductive electrode and said HSG—silicon seeds.

13. A method according to claim 12 wherein said step of growing said HSG—silicon seeds comprises heating said capacitor electrode and said HSG—silicon seeds to a temperature in the range of 560° C. to 630° C.

14. A method according to claim 13 wherein said capacitor electrode is formed from silicon.

15. A method according to claim 9 wherein said step of forming said HSG—silicon seeds is performed by chemical vapor deposition using a silicon source gas.

16. A method according to claim 9 wherein said step of removing said HSG—silicon seeds from the microelectronic substrate comprises etching said HSG—silicon seeds using an etching gas including chlorine.

17. A method according to claim 16 wherein said etching gas is chosen from the group consisting of $Cl_2$, $BCl_3$, $ClF_3$, and $HCl$.

18. A method according to claim 9 wherein said microelectronic substrate comprises a semiconductor substrate and wherein said step of forming said conductive electrode is preceded by the step of:

forming an insulating layer on the semiconductor substrate wherein said insulating layer has a contact hole therein exposing a portion of the semiconductor substrate and wherein said conductive electrode is connected to the semiconductor substrate through said contact hole.

* * * * *